(12) United States Patent
Gong et al.

(10) Patent No.: US 12,557,221 B2
(45) Date of Patent: Feb. 17, 2026

(54) MOLDED PACKAGES WITH THROUGH-MOLD INTERCONNECTS

(71) Applicant: NXP USA, Inc., Austin, TX (US)

(72) Inventors: Zhiwei Gong, Chandler, AZ (US); Lakshminarayan Viswanathan, Chandler, AZ (US); Li Li, Scottsdale, AZ (US)

(73) Assignee: NXP USA, INC., Austin, TX (US)

( * ) Notice: Subject to any disclaimer, the term of this patent is extended or adjusted under 35 U.S.C. 154(b) by 217 days.

(21) Appl. No.: 18/518,377

(22) Filed: Nov. 22, 2023

(65) Prior Publication Data

US 2025/0168987 A1   May 22, 2025

(51) Int. Cl.
*H05K 1/18* (2006.01)
*H05K 1/181* (2026.01)
*H05K 1/185* (2026.01)
*H05K 3/00* (2006.01)

(52) U.S. Cl.
CPC ............. *H05K 1/185* (2013.01); *H05K 1/181* (2013.01); *H05K 3/0017* (2013.01); *H05K 2201/2018* (2013.01); *H05K 2203/0415* (2013.01); *H05K 2203/176* (2013.01)

(58) Field of Classification Search
CPC ...... H05K 1/185; H05K 1/181; H05K 3/0017; H05K 2201/2018; H05K 2203/0415; H05K 2203/176
USPC ....................................................... 361/760
See application file for complete search history.

(56) References Cited

U.S. PATENT DOCUMENTS

| | | |
|---|---|---|
| 6,238,952 B1 | 5/2001 | Lin |
| 7,671,457 B1 | 3/2010 | Hiner et al. |
| 7,799,611 B2 | 9/2010 | Ramos et al. |
| 8,916,421 B2 | 12/2014 | Gong et al. |
| 9,218,987 B2 | 12/2015 | Liu et al. |
| 9,299,631 B2 | 3/2016 | Jang et al. |
| 11,557,525 B2 | 1/2023 | Gong et al. |
| 11,581,241 B2 | 2/2023 | Low et al. |
| 2009/0050994 A1* | 2/2009 | Ishihara ............ H01L 23/49816 257/E31.127 |
| 2009/0230525 A1 | 9/2009 | Chang Chien et al. |

(Continued)

OTHER PUBLICATIONS

U.S. Appl. No. 19/055,898; not yet published; 21 pages (filed Feb. 18, 2025).

(Continued)

*Primary Examiner* — Binh B Tran

(57) ABSTRACT

Molded device packages which allow electrical contacts to coupled to a first surface of a circuit substrate such as a printed circuit board while allowing the opposite surface to remain exposed for other purposes such as bonding thermal structures such as heatsinks include electrically-conductive pillars which are bonded to the first surface of the substrate and encapsulated in molding material. The molding material can one or more cavities over disposed over the first surface of the substrate which can be evacuated or gas-filled. The electrically-conductive pillars protrude from connected manifold and are joined to each other by a frame portion of the manifold. The manifold is patterned with a masking material that protects the pillars from being etched during a selective etching process which removes the frame portion of the manifold to separate the electrically-conductive pillars from each other.

19 Claims, 7 Drawing Sheets

(56) References Cited

U.S. PATENT DOCUMENTS

| | | |
|---|---|---|
| 2011/0147901 A1 | 6/2011 | Huang et al. |
| 2011/0298109 A1 | 12/2011 | Pagaila et al. |
| 2017/0040292 A1 | 2/2017 | Hsu et al. |
| 2017/0047264 A1 | 2/2017 | Im et al. |
| 2018/0358276 A1 | 12/2018 | Chiu et al. |
| 2019/0131262 A1 | 5/2019 | Yu et al. |
| 2021/0090970 A1* | 3/2021 | Hall .................. H01L 23/3128 |
| 2022/0130768 A1 | 4/2022 | Wei et al. |
| 2023/0115340 A1 | 4/2023 | Wei et al. |
| 2023/0223322 A1 | 7/2023 | Chiu et al. |

OTHER PUBLICATIONS

U.S. Appl. No. 19/055,753; not yet published; 20 pages (filed Feb. 18, 2025).

LPKF North America, "Active Mold Packaging (AMP) The Technology behind Active Mold Packaging", downloaded from https://www.lpkfusa.com/products-technologies/semiconductor-packaging/active-mold-packaging-overview on Mar. 12, 2025, pp. 1-6.

\* cited by examiner

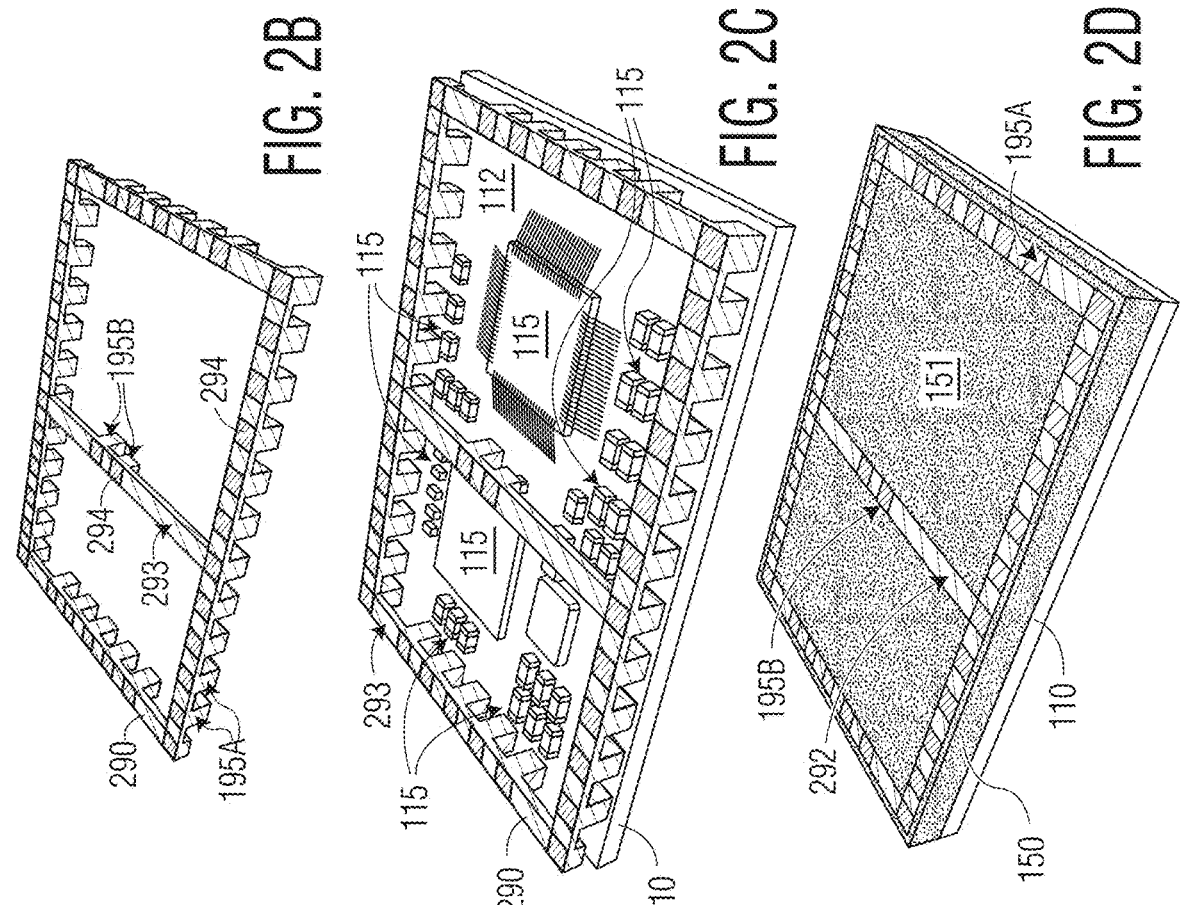
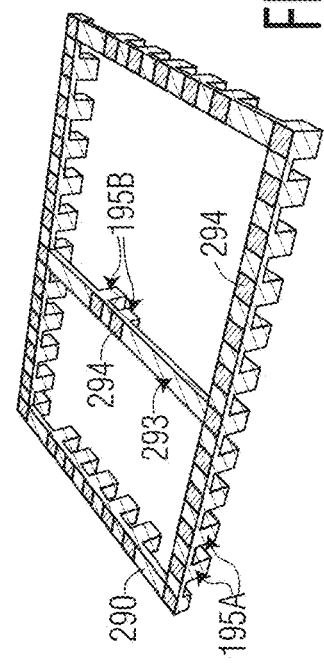
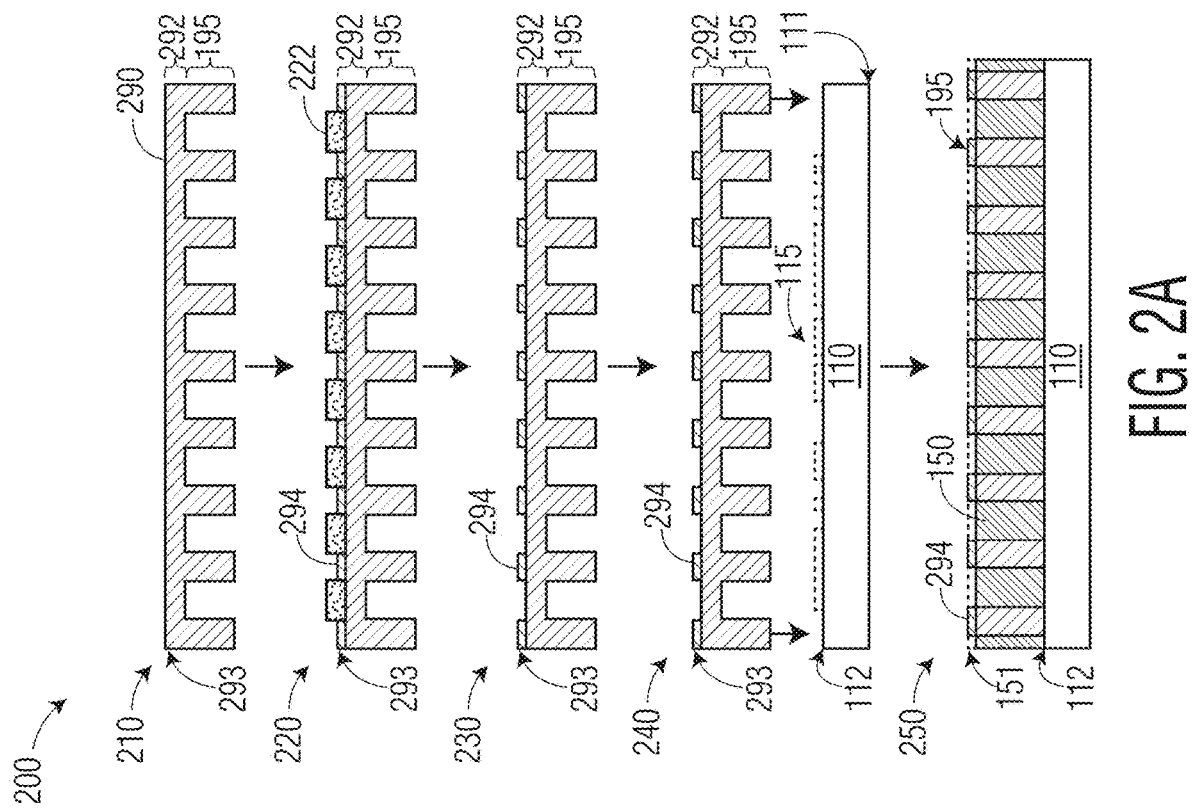

MOLDED PACKAGES WITH THROUGH-MOLD INTERCONNECTS

TECHNICAL FIELD

Embodiments of the subject matter described herein relate to molded packages for electronic devices.

BACKGROUND

Electronic devices such as integrated circuits are often packaged in polymer or ceramic housings which can be designed to protect the devices from damage, help dissipate heat, and to provide macroscopic contacts that allow the devices to be coupled to other devices on printed circuit boards and other substrates.

SUMMARY

In an example embodiment, a method of forming a device package includes providing an electrically conductive manifold that includes a frame structure. The frame structure defines a plane and electrically conductive pillars protrude from the frame structure in a direction perpendicular to the plane defined by the frame structure. The method further includes encapsulating the manifold in a volume of molding material and bonding the manifold to a first surface of a circuit substrate such that a surface of the manifold in the plane defined by the frame structure is an exposed surface disposed above the circuit substrate and surrounded by the volume of molding material. The method further includes selectively removing material of the frame structure to separate the electrically conductive pillars from each other. One or more of the electrically conductive pillars is electrically coupled to an electronic component disposed on the circuit substrate.

In another example embodiment, a method of forming a device package includes providing an electrically conductive manifold that includes a frame structure. The frame structure defines a plane and electrically conductive pillars protrude from the frame structure in a direction perpendicular to the plane defined by the frame structure. The method further includes encapsulating the manifold in a volume of molding material and bonding the manifold to a first surface of a circuit substrate such that a surface of the manifold in the plane defined by the frame structure is an exposed surface disposed above the circuit substrate and surrounded by the volume of molding material. The method further includes selectively removing material of the frame structure to separate the electrically conductive pillars from each other. The method further includes selectively removing material of the frame structure to separate the electrically conductive pillars from each other. The device package includes a cavity disposed between the volume of molding material and the first surface of the circuit substrate. One or more of the electrically conductive pillars is electrically coupled to an electronic component disposed on the circuit substrate.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein:

FIG. 2A shows cross-sectional views of steps of a method of forming a device package according to one or more embodiments.

FIG. 2B is a perspective view of the manifold pictured in FIG. 2A.

FIG. 2C is a perspective view of the manifold pictured in FIGS. 2A and 2B bonded to a circuit substrate.

FIG. 2D is a perspective view of the manifold and substrate pictured in FIGS. 2A, 2B, and 2C after being molded together.

DETAILED DESCRIPTION

Figure 1A:
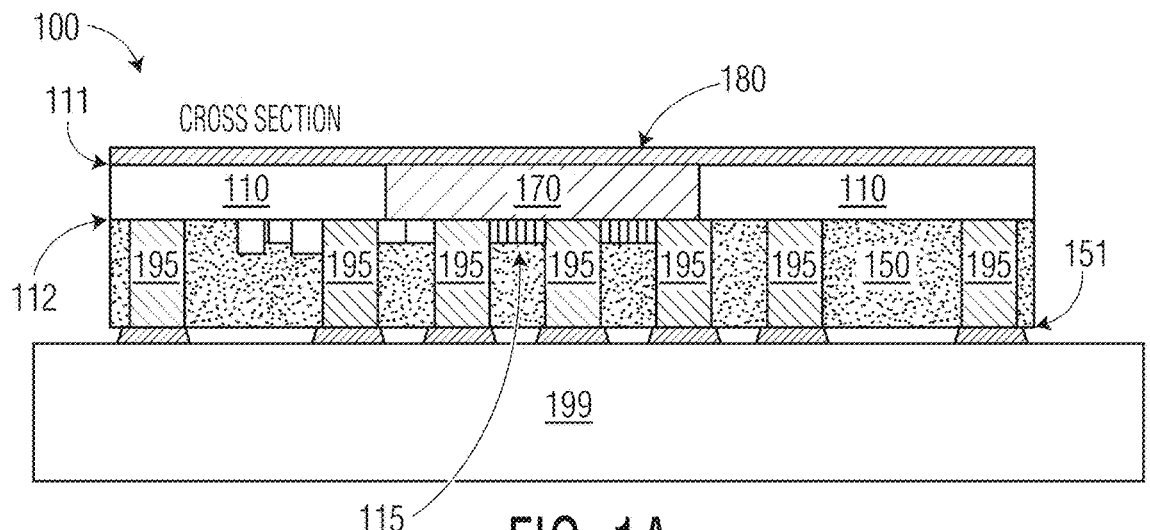
FIG. 1A shows a cross-sectional view of an electronic device package according to one or more embodiments.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order.

It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation, and are made with reference to the orientation of the corresponding figure or figures for purposes of illustration.

Unless explicitly stated otherwise, the use of terms "approximately," "substantially" and similar terms in connection with dimensions, relative positioning, or orientation of various features indicates that the dimensions, positioning, or orientation of those features are subject to tolerances and/or expected process variations of equipment and processes chosen to form the described features. Unless explicitly stated otherwise, the use of terms "approximately," "substantially" and similar terms in connection measurable values or characteristics is subject to the expected measurement accuracy of equipment and methods used to measure those values or characteristics and/or within tolerance limits specified by technical standards applicable to the technologies described.

It will be appreciated that the steps of various processes described herein are non-limiting examples of suitable processes according to embodiments and are for the purposes of illustration. Embodiments herein may use any suitable processes including those that omit steps described herein, perform those steps and similar steps in different orders, and the like. It will also be appreciated that well-known features and techniques may be omitted for clarity.

Conventional chip packages frequently include electronic components disposed on the top surface of substrate which includes electrical interconnections are routed to an opposite side of the substrate. The substrate can be molded and the interconnections on the back side of the substrate can be connected to a lead frame or other structure that provide macroscopic electrical contacts that are exposed on the outside of the package. In such packages, thermal structures such as heatsinks may be mounted to a surface of the package above the substrate. For some applications it has become desirable to incorporate large thermal structures or other structures directly into packaged substrates. However, doing so can have the effect of reducing or eliminating available space for routing of electrical interconnections or increasing the minimum size of the substrates. Accordingly, embodiments herein enable large scale production of molded electronic device packages in which macroscopic electrical interconnections are made on the same surface of a substrate (e.g., a printed circuit board) where electronic components are mounted, rather than being coupled to components from the opposite side of the substrate. Such arrangements can enable incorporation of thermal structures that pass through the entire thickness of a substrate such as a circuit board while still allowing for space-efficient routing of electrical interconnections.

Figure 1B:
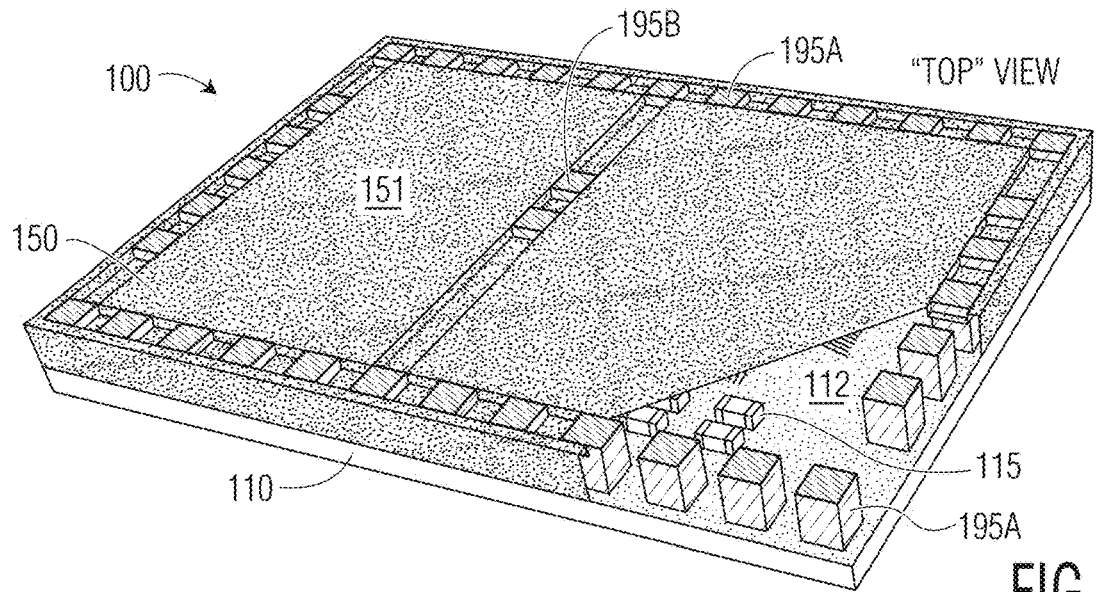
FIG. 1B shows a top perspective view of the package of FIG. 1A.
Figure 1C:
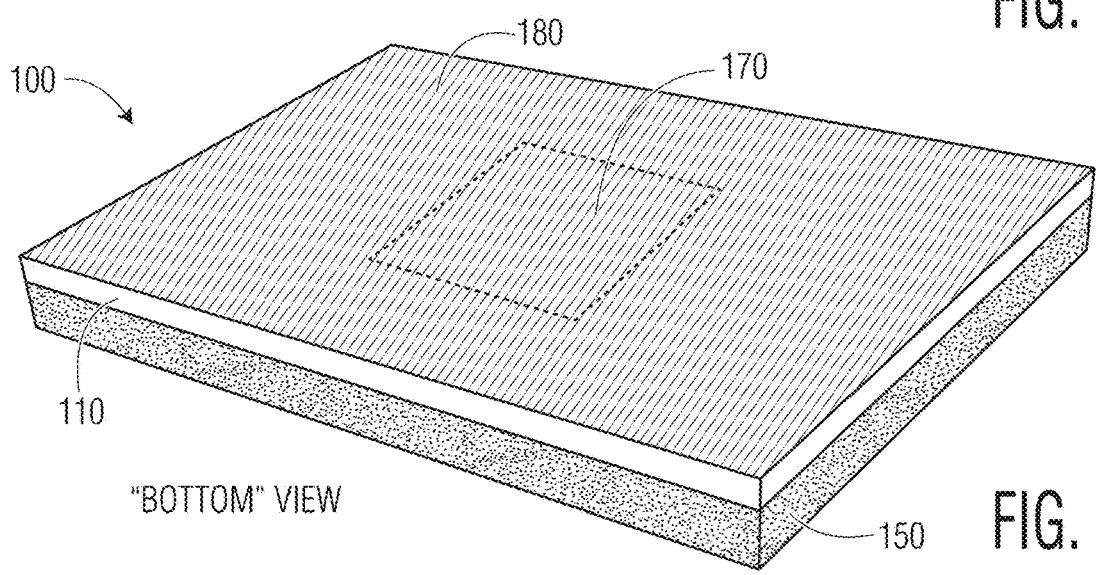
FIG. 1C shows a bottom perspective view of the package of FIGS. 1A and 1B.

FIGS. 1A, 1B, and 1C show three views of an example assembly (i.e., an electronic device package) according to one or more embodiments. As can be seen in the cross-sectional view of FIG. 1A, the package 100 includes a circuit substrate 110 which is overlayed by a volume of molding material 150 a set of electrically conductive pillars 195 (hereinafter, "conductive pillars") pass through the volume of molding material and are coupled to the circuit substrate 110. Individual conductive pillars 195 form electrical interconnects that are coupled to electronic components 115 which are disposed on (and electrically coupled to) the circuit substrate 110 (e.g., by being electrically coupled to metallic contact pads, vias, conductive traces, or other such structures on or within the circuit substrate 110). The package 100 (i.e., an electronic device package) can be mechanically coupled to a larger assembly or substrate (e.g., the circuit board 199) using any suitable methods, including solder bonds, as pictured. In the example of FIGS. 1A, 1B, and 1C, the substrate 110 includes a "coin" (the coin 170), which is a solid block of thermally conductive material (e.g., a metal such as copper). One or more of the electronic components 115 are disposed in thermal contact with the coin 170 which can form part of a larger heatsink or other thermal dissipation or thermal conduction structure. In this example, as can be seen in FIG. 1A and FIG. 1C, the bottom surface 111 of the substrate 110 is coated with a metallization layer 180 which can further distribute heat from the coin 170. Additional thermal structures may be coupled to the metallization layer 180.

The volume of molding material 150 and the pillars 195 can be seen more clearly in the "top" view of FIG. 1B. It will be understood that top and bottom in this context are relative to the "top" surface 112 of the substrate 110 and that, in various applications, the package 100 may be oriented in any suitable manner. In the top view of FIG. 1B, a portion of the molding material 150 is removed in order to provide a view of electronic components 115 on the top surface of the substrate 110. It will be understood that the electronic components 115 shown are examples and that any suitable components can be coupled to a substrate such as the substrate 110 in embodiments disclosed herein. It will also be understood that electrical connections between the electronic components 115 and the pillars 195 (e.g., conductive traces on or within the substrate 110) are not explicitly shown. In one or more embodiments, as illustrated in the top view of the package 100 in FIG. 1B, a device package includes conductive pillars on a periphery of the package (e.g., pillars 195A) as well as one or more pillars located toward a center of the package (e.g., one or more pillars 195B).

The "bottom" view of FIG. 1C shows the metallization layer 180 with the position of the coin 170 within the package 100 indicated by a dashed rectangle. When the package 100 is oriented as shown in the "bottom view," it can be bonded to a substrate such as the circuit board 199 or any other suitable surface, leaving the metallization layer 180 exposed which can enable coupling additional thermal dissipation structures to the package 100. As non-limiting examples, a large passive heatsink device or a thermoelectric cooling device can be coupled to the metallization layer via suitable thermal interface material (e.g., thermal paste, conductive epoxy, and the like).

As will be explained further below, packages according to embodiments herein such as the package 100 can have advantageous features for various applications. For example, they can facilitate the use of molded packages in so-called top-side cooling approaches in which the bottom side (e.g., the bottom surface 111 of the substrate 110) of a circuit substrate (e.g., polymer-based printed circuit boards, ceramic circuit boards, and/or other related structures) which is often used for electrical interconnections (e.g., bond pads, solder bumps, electrical pins or sockets, and the like) is instead used for thermal dissipation structures (e.g., heatsinks such as the coin 170 and additional thermal structures such as the metallization layer 180), while still providing expected structures for electrical interconnects and mechanical coupling of the package to larger assemblies (e.g., larger circuit substrates that include numerous packaged devices). Additionally, as will be explained further below, packages according to embodiments herein are not limited to having electrical interconnects around a periphery of the package alone; instead, conductive pillars used for electrical interconnects and/or for other purposes may be placed anywhere on the exposed surface of the molding material (e.g., the volume of molding material 150). Any suitable molding materials may be used in embodiments herein, including, as non-limiting examples, silica filled epoxy resins, silicone resins, and the like.

FIG. 2A illustrates steps in an example process according to one or more embodiments that is suitable for use in fabricating packages such as the package 100 of FIGS. 1A, 1B, and 1C according to embodiments herein. The process 200 includes the steps 210, 220, 230, 240 and 250. The steps 210-250 are depicted and described with reference to forming the package 100. It will be appreciated the process 200 is intended as a nonlimiting example and that packages and methods according to embodiments herein may include additional steps that are not described as part of the process 200, may omit steps of the process 200 or similar steps, and may include steps of the process 200 or similar steps performing in a different order than described in connection with the process 200.

At step 210, a conductive manifold 290, pictured in cross-section is provided (the conductive manifold may also be referred to as a leadframe or leadframe manifold). The manifold 290 can be described as having a frame portion 292. The electrically conductive pillars 195 extend from the frame portion 292 and are connected to each other by the frame portion 292. As shown in the perspective view of FIG. 2B, the conductive pillars 195A, 195B of the package 100 of FIGS. 1A, 1B and 1C correspond to portions of the manifold 290 which will be separated from each other to form the conductive pillars 195A, 195B of the package 100. It will be appreciated that an upper surface 293 of the manifold can be said to lie in a plane defined by the frame portion 292. The upper surface 293 of the manifold can be selectively coated with a protective material 294 disposed above each pillar 195. Formation of this protective material 294 is described below.

At step 220, a masking material 222 is patterned on the upper surface 293 of the manifold 290. The protective material 294 is applied to the upper surface 293 above the location of each pillar 195 (or otherwise formed on the upper surface 293), followed by removal of the masking material 222 at step 230. The masking material can be any suitable material patterning by any suitable methods including, but not limited to, a photoresist patterned using known photolithographic processes. The protective material can also be any suitable material deposited by any suitable process. In one or more embodiments, the manifold is made of copper or a copper alloy and the protective material is another metal that is deposited on the manifold via electroplating, thermal evaporation, sputtering, or any other suitable process. The protective material 294 can serve as an etch mask, enabling selective removal of the material forming the frame portion 292 of the manifold 290 in a subsequent step.

In one or more embodiments, a protective material such as the protective material 294 is readily solderable, allowing a package such as the package 100 to be mechanically coupled to a structure such as the circuit board 199 using standard circuit board assembly processes. In one or more embodiments, a protective material such as the protective material 294 is a multi-layer metal stack. As one nonlimiting example, a protective material can include layers of nickel, palladium, and gold having a total thickness of 2 µm or less. In one or more embodiments, a protective material such as the protective material 294 is an electrically insulating or resistive material and is removed at a later step. For instance, the protective material can be an oxide that is grown or otherwise formed on the upper surface 293. It will be understood that in one or more embodiments, a manifold such as the manifold 290 may be provided with protective material such as the protective material 294 already pattern on the manifold. In such embodiments, the step 220 or a similar can be omitted.

At step 240, the manifold 290 is bonded to the top surface 112 of the substrate 110 and one or more of the conductive pillars 195 are electrically coupled to one or more electronic components 115 disposed on the substrate 110. The result of step 240 can be seen in the perspective view of FIG. 2C.

At step 250, the pillars 195 are encapsulated within the volume of molding material 150 (see also the perspective view of FIG. 2D), leaving the upper surface 293 of the manifold 290 exposed at the surface 151 of the volume of molding material 150. In one embodiment, the film assisted molding is used to protect the upper surface 293 and protective material 294 from mechanical damage and resin bleeding during encapsulation process. The cross-sectional view of step 250 corresponds to a line passing through the center of a row of pillars 195, resulting in the stepped profile in which the top of each pillar 195 protrudes above the surface 151 of the volume of molding material 150. The material of the frame portion 292 of the manifold 290 is selectively removed from the areas that are not covered by the protective material 294, leaving the pillars 195 separated from each other and surrounded by the molding material 150 with the tops of each pillar 195 exposed. The material of the frame portion 292 may be removed, as a nonlimiting example, by a suitable etching process that preferentially etches the exposed material of the frame portion 292 compared to the protective material 294. Examples of suitable processes include, but are not limited to, wet chemical etching processes and/or dry plasma etching processes such as sputter etching or reactive ion etching. In one or more embodiments, exposed portions of a copper manifold are etched using ammonium persulfate), ferric chloride and nitric acid (e.g., to remove exposed portions of a frame such as the frame 292). It will be understood that the relative heights of the molding material 550 and the pillars 595 are not necessarily to scale and may be exaggerated for ease of understanding. It will be further understood that any suitable methods can be used to form molded features according to embodiments herein and that shapes of profiles of various features may differ from the examples in the Figures. As one example, film-assisting molding can be used to mold a manifold such as the manifold 290. In such an example, both the protective material 294 and the top surface 293 can protrude above the molding material.

Figure 3A:
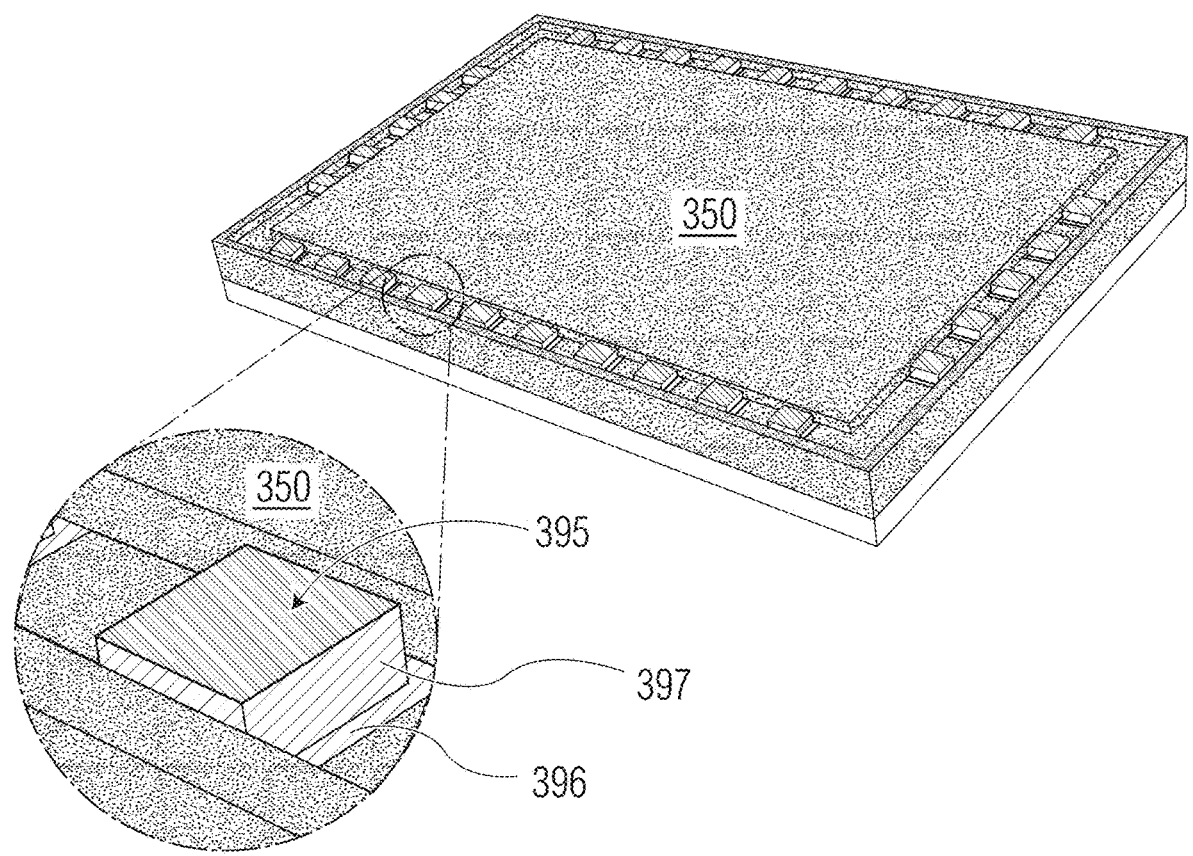
FIG. 3A shows perspective views of a package according to one or more embodiments.

FIG. 3 shows a perspective view of another example package. In one or more embodiments, one or more conductive pillars are patterned as illustrated by the package 300 of FIG. 3A. Specifically, a conductive pillar such as the pillar 395 shown is patterned such that it has a "top-hat" or tenon-shaped profile, with a first recessed portion 396 that is flush or approximately flush the with the volume of molding material 350, and a second portion 397 that extends above the recessed portion 396. Such a profile can be achieved in a process similar to the process 200 of FIG. 2A. For example, if the width of the masking material 222 is increased such that it extends beyond each conductive pillar, the protective material 294 will cover a central portion of each conductive pillar (e.g., corresponding to the second portion 397 of the pillar 395), leaving a peripheral portion (e.g., corresponding to the recessed portion 396 of the pillar 395) exposed. After the manifold 290 is etched (e.g., at step 250 of the process 200), the resulting pillars will have a profile similar to the pillar 395 of FIG. 3A.

Figure 3B:
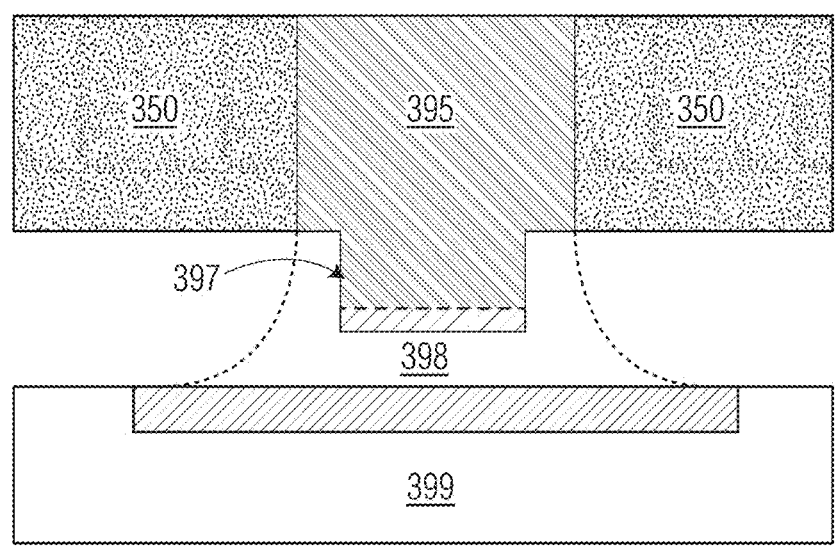
FIG. 3B shows a cross-sectional view of the package of FIG. 3A bonded to a substrate.

The "tenon" or "top-hat" profile of the pillar 395 can be desirable for various applications, as illustrated by FIG. 3B which shows the pillar 395 in cross-section, bonded to a substrate 399 via a solder bond 398. In the example of FIG. 3B, the soldering process has produced a solder fillet that is bonded to the sidewalls of the of the second portion 397 and also to the recessed portion 396 of the pillar 395. It will be appreciated that the solder bond 398 to the pillar 395 can contact a larger surface area of the pillar 395 compared to pillars of similar dimensions that lack the profile of the pillar 395 (e.g., pillars 195). As a result, the solder bond 398 to the pillar 395 may exhibit improved reliability.

It will be understood that, although the peripheral portions of the pillars 395 (e.g., corresponding to the recessed portions 396 of the pillars 395) are shown surrounding each pillar 395, that a pillar such as a pillar 395 can have any number of sides with a recessed portion. Thus, in one or more embodiments, one or more conductive pillars have a recessed portion on one or more sides. In one or more such embodiments, a conductive pillar includes a recessed portion on two sides and in one or more embodiments a conductive pillar includes a recessed portion on four sides. It will be further understood that nothing herein is intended to limit conductive pillars according to embodiments herein to a rectangular or square cross-sectional profile and that conductive pillars according to embodiments herein can have circular or elliptical cross-sectional profiles as non-limiting examples (i.e., in one or more embodiments, the top of a pillar may appear rounded rather than square or rectangular shown in FIG. 3A).

Figure 4:
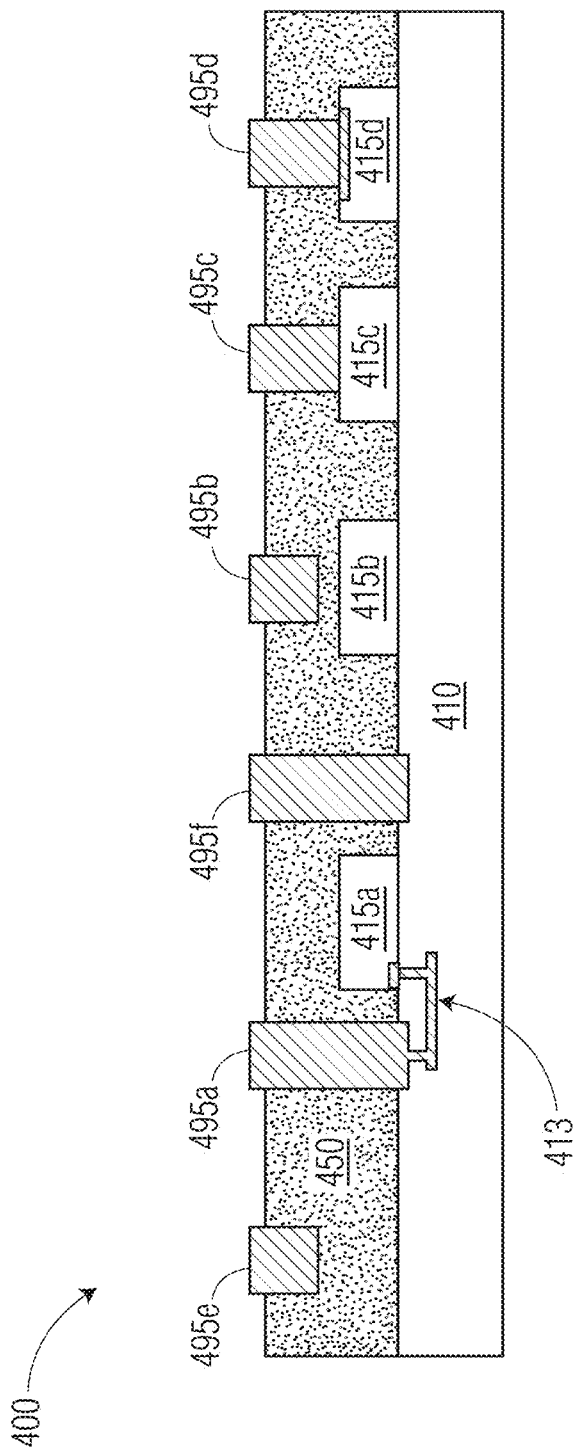
FIG. 4 is a cross-sectional view of an example package illustrating features present in one or more embodiments.

FIG. 4 is a cross-sectional view of an example package illustrating features of conductive pillars that are present in one or more embodiments. It will be appreciated that different embodiments can incorporate pillars similar to any one or more of the pillars 495 shown. As a first example, in one or more embodiments, a pillar such as the pillar 495a passes through a volume of molding material 450 (e.g., molding material 150 or 350) and contacts an electrical interconnect (e.g., the interconnect 413) that is electrically coupled to a component such as the component 415a that is disposed on a substrate such as the substrate 410. In this example, the component 415a is shown with a surface contact pad for purposes of illustration. However, it will be appreciated that components in embodiments herein may use any suitable contacts and interconnections.

As another example, in one or more embodiments a conductive pillar such as the pillar 495b or the pillar 495e passes through a portion of a volume of molding material such as the molding material 450 without contacting an underlying substrate such as the substrate 410. In one or more such embodiments, the pillar (e.g., the pillar 495b) may be disposed above an electronic component such as the component 415b without contacting that component. It will be appreciated that "dummy" pillars such as the pillar 495b, 495e may be useful to provide additional locations to bond a package such as the package 400 to a larger substrate and/or to provide increased stiffness of a package such as the package 400.

In one or more embodiments, a dummy pillar such as the pillar 495f passes through an entire thickness of a volume of molding material such as the molding material 450 but does not contact an electrical component on the underlying substrate. In or more embodiments, a pillar such as the pillar 495c passes through a volume of molding material such as the molding material 450 and contacts a surface of an electronic component such as the component 415c. In one or more such embodiments, a pillar (e.g., a pillar 495) is configured to conduct heat toward or away from the electronic component. As a further example, in or more embodiments, a pillar such as the pillar 495d may pass through a volume of molding material and contact a conductive feature such as a contact pad on a surface of an electronic component such as the component 415d and is electrically coupled to the component.

Figure 5A:
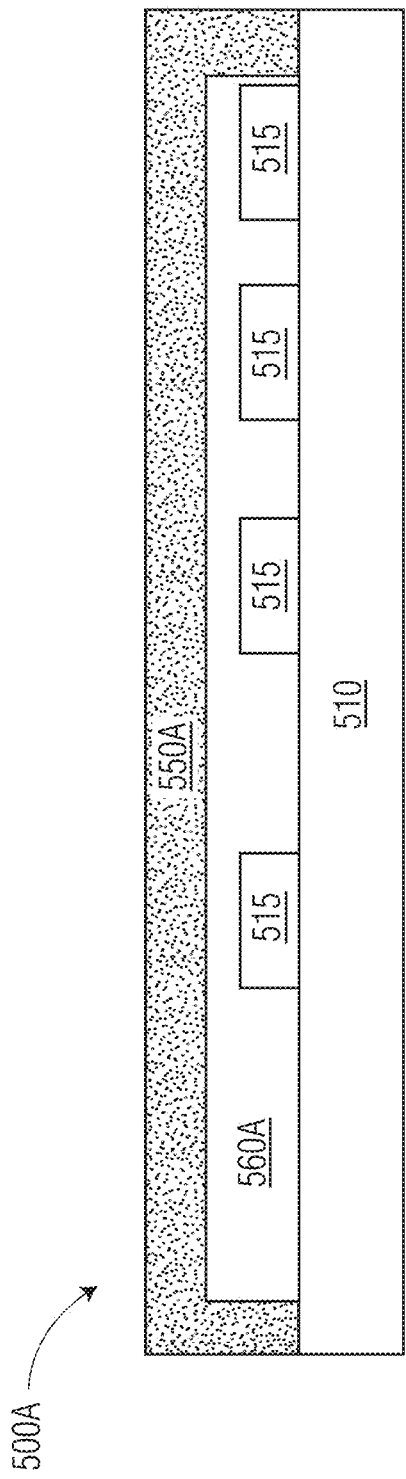
FIG. 5A is a cross-sectional view of an example package that includes a hollow cavity according to one or more embodiments.
Figure 5B:
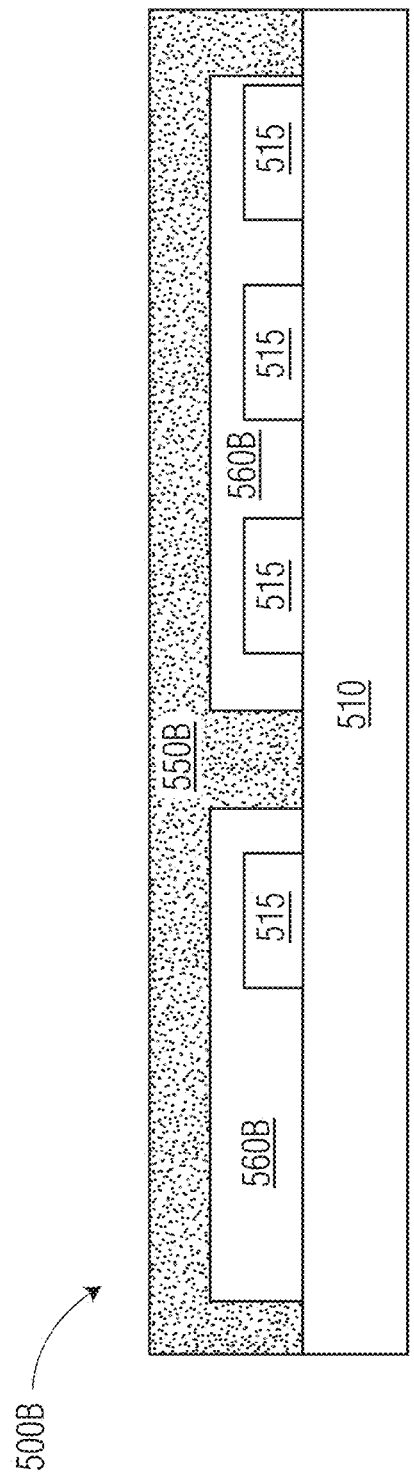
FIG. 5B is a cross-sectional view of an example package that includes multiple hollow cavities according to one or more embodiments.

In one or more embodiments, a package such as the package 500A shown in cross-section in FIG. 5A includes a hollow cavity in a volume of molding material. The cross-sectional view of FIG. 5A does not show any conductive pillars for clarity. The package 500A includes a hollow cavity 560A in the volume of molding material 550A above the substrate 510, shown with electronic components 515. In one or more embodiments, a package such as the package 500B shown in cross-section in FIG. 5B includes two or more hollow cavities such as the cavities 560B in a volume of molding such as the molding material 550B.

It will be appreciated that the packages 500A, 500B are shown for purposes of illustration and that packages according to embodiments herein may have any suitable number of hollow cavities arranged in any suitable fashion. For instance, a hollow cavity may have any suitable size and location within a package. In addition, a package may have hollow cavities with different sizes and depths.

Figure 6:
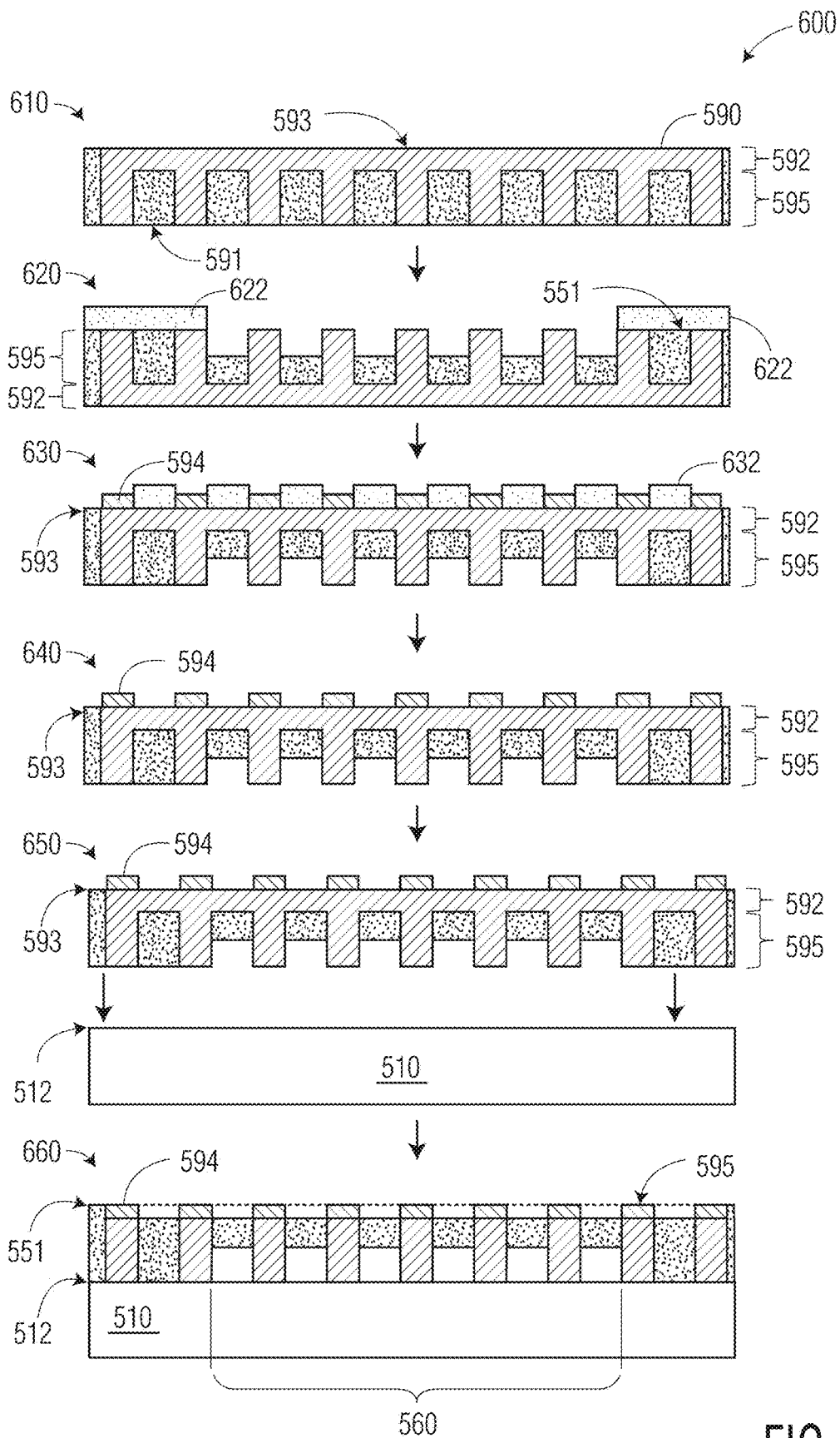
FIG. 6 shows cross-sectional views of steps of a method for forming a device package that includes one or more hollow cavities according to one or more embodiments.

Packages with hollow cavities such as the packages 500A, 500B and related structures may be formed using any suitable methods. FIG. 6 illustrates an example process suitable for forming a package 500 (e.g., a package 500A or 500B). The process 600 includes the steps 610, 620,630, 640, 650, and 660. The steps 610-660 are depicted and described with reference to forming a package 500. It will be appreciated the process 600 is intended as a nonlimiting example and that packages and methods according to embodiments herein may include additional steps that are not described as part of the process 600, may omit steps of the process 600 or similar steps, and may include steps of the process 600 or similar steps performing in a different order than described in connection with the process 600.

At step 610, a conductive leadframe or manifold 590 (e.g., a manifold 290) is received. The manifold 590 may be previously encapsulated ("molded") within a volume of molding material 550, as shown. The manifold 590 includes a frame portion 592 and conductive pillars 595 (e.g., the frame portion 292 of the manifold 290 and pillars 195).

At step 620, a masking material 622 (e.g., photoresist or masking material 222) is patterned using any suitable process, including a photolithographic process over the surface 551 of the molding material 550. Portions of the molding material 550 that are not covered by the masking material 622 are etched to a desired depth as shown. The step 620 can be performed with the manifold 590 inverted as shown relative to the orientation of the manifold 590 pictured at step 610.

At step 630 (e.g., step 220 of the process 200), a masking material 632 is patterned on the upper surface 593 of the manifold 590. The protective material 594 is applied to the upper surface 593 or otherwise formed on the upper surface 593 above the location of each pillar 595. The masking material (e.g., the masking material 222) can be any suitable material patterning by any suitable methods including, but not limited to, a photoresist patterned using known photolithographic processes. The protective material 594 (e.g., the protective material 294) can also be any suitable material deposited by any suitable process.

At step 640, the masking material 632 is removed, leaving the protective material 594 on the upper surface 593 of the manifold 590 above each pillar 595. Alternatively, In one or more embodiments, a protective coating such as the protective material 594 can be formed by a subtractive process in which the protective coating is formed over the entire upper surface 593 and is selectively removed from areas that are in between the pillars 595.

At step 650, the manifold 590 along with the previously patterned molding material 550 is bonded to the surface 512 of the substrate 510, thereby forming a hollow cavity (e.g., the cavity 560A of FIG. 5A). It will be understood that the molding material 550 can be patterned in any suitable manner to create multiple cavities (e.g., the cavities 560B of FIG. 5B) or a multi-step process can be substituted for the step 620 to produce cavities with multiple depths at the step 650. Cavities such as the cavities 560A, 560B and other cavities can also be formed in an alternative process in which the cavities are defined using film-assisted molding with patterned inserts and/or other known molding techniques in place of steps 610 and 620. It will be appreciated that the substrate 510 is populated with components 515 prior to attachment of the manifold 590.

Finally, at step 660 (e.g., step 250 of the process 200), the frame portion 592 of the manifold 590 is selectively removed to separate the pillars 595 from each other. It will be understood that the relative heights of the molding material 550 and the pillars 595 are not necessarily to scale and may be exaggerated for ease of understanding.

As above, in one or more embodiments, steps of processes such as the process 600 can be omitted, modified, or performed in a different order. For example, in one or more embodiments, a manifold such as the manifold 590 can be encapsulated ("molded") with a hollow cavity directly by using customized mold tooling. In one or more such embodiments the manifold can be etched to remove the frame portion of the manifold prior to being bonded to a substrate such as the substrate 510 because the manifold has already been molded prior to attachment to the substrate 510 and the conductive pillars will remain fixed within the molding material when the frame portion of the manifold is removed.

In one or more embodiments, as illustrated in FIG. 1B, a conductive pillar such as a pillar 195B passes through a central portion of a package such as the package 100 rather than through a peripheral or edge portion of the package. It will be understood that such "central" or "centrally-disposed" conductive pillars can have any suitable depth profile within a volume of molding material (e.g., molding material 150, 350, 450, or 550), as previously described in connection with FIG. 4. In one or more embodiments, as illustrated by FIGS. 7A, 7B and 7C, one or more conductive pillars (e.g., one or more conductive pillars 795B) which are located toward the center of a package such as the package 700 can be electrically coupled to pillars on the periphery of the package (e.g., one or more pillars 795A) by a cantilevered portion 796 of the manifold 790 which is covered by protective material 794 (e.g., protective material 294) such that it is not etched away during a fabrication process such as the process 200 or the process 600.

Figure 7A:
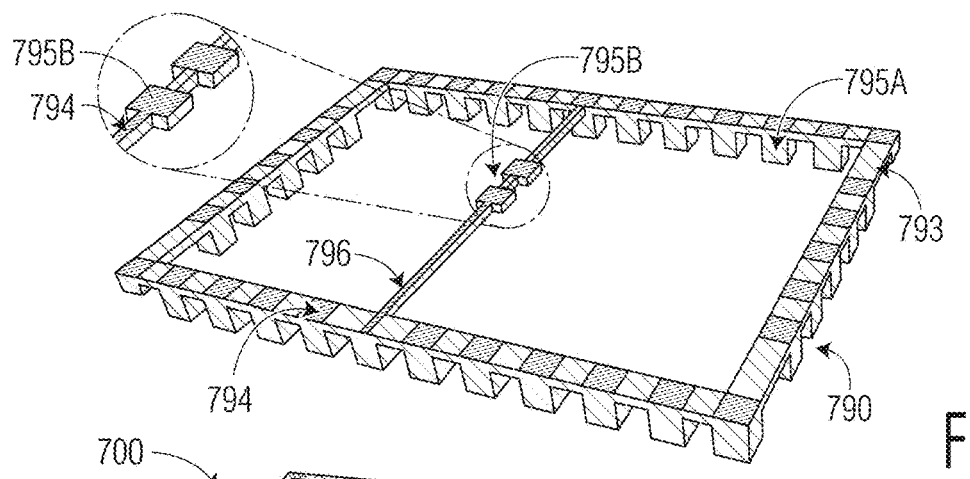
FIG. 7A is a perspective view of a manifold that includes additionally "centrally-disposed" electrically-conductive pillars according to one or more embodiments.
Figure 7B:
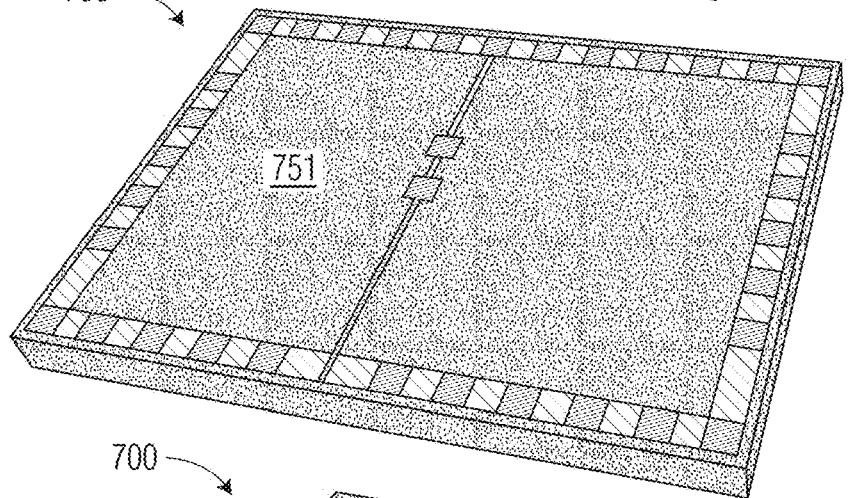
FIG. 7B is a perspective view of the manifold pictured in FIG. 7B after being molded and bonded to a circuit substrate.
Figure 7C:
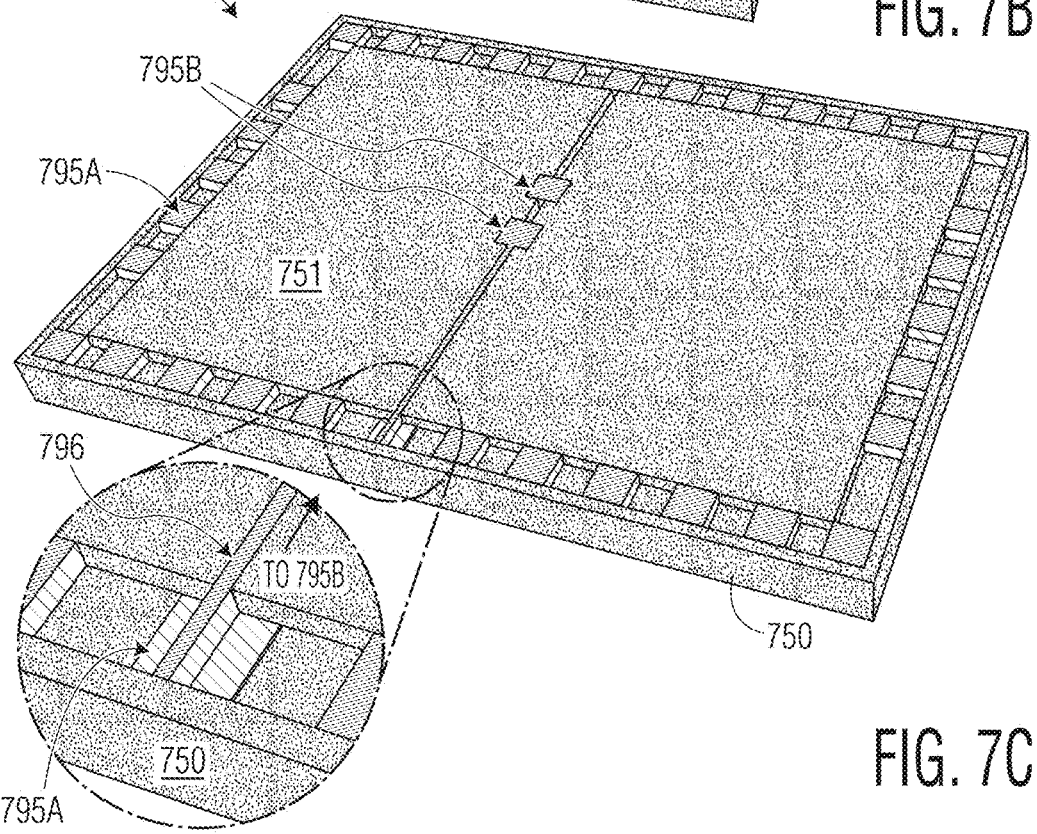
FIG. 7C. is a perspective view of the manifold and substrate pictured in FIGS. 7A and 7B after the manifold has been etched to separate the pillars (with the exception of one of the centrally-disposed pillars).

FIG. 7A shows the manifold 790 together with an inset showing a pillar 795B in greater detail. It will be appreciated that a cantilevered portion of a manifold (e.g., the cantilevered portion 796) may have any suitable dimensions and can be thinner, thicker, longer, or shorter than the cantilevered portion 796 shown. FIG. 7B shows the manifold 790 after being molded in the volume of molding material 750, with the top portion of the manifold visible at the top surface 751 of the molding material 750. After the manifold 790 is etched (as shown in FIG. 7C), one of the two pillars 795B will be connected to one of the pillars 795A via a cantilevered portion that was protected from being etched by the protective material 794. while the second pillar 795B is not connected to any other pillar 795 (i.e., a pillar 795A or 795B) because the portions of the manifold 790 As a result, one pillar 795B will be electrically coupled to a pillar 795A as shown in FIG. 7C while the other pillar 795B will be disconnected from any other pillar 795 as shown in FIG. 7C, resulting in a so-called "dummy pillar" which can be used for mechanical reinforcement, electrical shielding purposes, or any other desired purpose. The enlarged inset of FIG. 7C shows the cantilevered portion 796 of the manifold 790 at the point where it couples one of the pillars 795B to a pillar 795A on the periphery of the package 700.

VARIOUS EXAMPLES

Features of embodiments may be understood by way of one or more of the following examples:

Example 1: A device package or method of forming a device package that includes an electrically conductive manifold that includes a frame structure. The frame structure defines a plane and electrically conductive pillars protrude from the frame structure in a direction perpendicular to the plane defined by the frame structure. The manifold is encapsulated in a volume of molding material and bonded to a first surface of a circuit substrate such that a surface of the manifold in the plane defined by the frame structure is an exposed surface disposed above the circuit substrate and surrounded by the volume of molding material. Material of the frame of is selectively removed, separating the electrically conductive pillars from each other. One or more of the electrically conductive pillars is electrically coupled to an electronic component disposed on the circuit substrate.

Example 2: The device or method of Example 1 where the manifold is formed from a first metallic material. A masking material is patterned on the exposed surface of the manifold first and an etching process preferentially removes the first metallic material compared to the masking material.

Example 3: The device or method of Example 1 or Example 2 where the masking material disposed on the exposed surface of the manifold comprises covering a central portion of the frame structure above each conductive pillar a peripheral portion of the frame structure above each conductive pillar exposed. The selective removal the material of the frame structure forms a tenon-shaped metal structure that is exposed at a surface of the volume of molding material.

Example 4: The device or method of any of Examples 1-3 where one or more conductive pillars pass through the volume of molding material to contact an electronic component disposed on the first surface of the circuit substrate.

Example 5: The device or method of any of Examples 1-4 where one or more conductive pillars pass through a portion of the volume of molding material without contacting the first surface of the circuit substrate.

Example 6: The device or method of any of Examples 1-5 where one or more conductive pillars pass through a portion of the volume of molding material and are disposed above a first electronic component on the first surface of the circuit substrate without contacting the first electronic component.

Example 7: The device or method of any of Examples 1-6 in which a recessed area in the volume of molding material is formed prior to bonding the manifold to the first surface of the circuit substrate and bonding the manifold to the first surface of the circuit substrate forms a cavity between the first surface of the circuit substrate and the volume of molding material.

Example 8: The device or method of any of Examples 1-7 where one or more conductive pillars pass through the volume of molding material and the cavity to contact the first surface of the circuit substrate.

Example 9: The device or method of any of Examples 1-8 where one or more conductive pillars pass through the volume of molding material and the cavity to contact an electronic component disposed on the first surface of the circuit substrate.

Example 10: The device or method of any of Examples 1-9 where the circuit substrate includes a thermally conductive structure that passes through a thickness of the circuit substrate. The thermally conductive structure is thermally coupled to a first electronic component on the first surface of the circuit substrate and is configured to transfer heat between the first electronic component and an external surface of the device package formed by a bottom surface of the circuit substrate.

Example 11: The device or method of any of Examples 1-10 where a first set of the conductive pillars is disposed along a periphery of the device package and the device package includes a centrally-disposed conductive pillar that passes through the volume of molding material and is surrounded by the first set of the conductive pillars.

Example 12: The device or method of any of Examples 11 where the centrally-disposed conductive pillar is electrically coupled to one or more of the first set of the conductive pillars.

Example 13: The device or method of any of Examples 1-12 where the manifold is encapsulated prior to bonding the manifold to the first surface of the circuit substrate.

Example 14: The device or method of any of Examples claim 1-13, where a peripheral portion of the manifold that includes a first set of the electrically conductive pillars is encapsulated such that the volume of molding material extends to a first distance beyond a top surface of the manifold in the direction perpendicular to the plane defined by the frame structure. A central portion of the manifold that is surrounded by the peripheral portion of the manifold is encapsulated such that the volume of molding material extends to a second distance that is less that the first distance beyond the top surface of the manifold in the direction perpendicular to the plane defined by the frame structure.

Example 15: The device or method of any of Examples 1-14 where one or more electronic components are disposed within the cavity and on the first surface of the circuit substrate.

Example 16: The device or method of any of Examples 1-15, where a first set of the conductive pillars is disposed along a periphery of the device package surrounding the cavity and the device package includes a centrally-disposed conductive pillar that passes through the volume of molding material and is surrounded by the first set of the conductive pillars.

Example 17: The device or method of Example 16 where the centrally-disposed conductive pillar is electrically coupled to one or more of the first set of the conductive pillars.

Example 18: The device or method of Example 17, where the centrally-disposed conductive pillar passes through the cavity and contacts an electronic component disposed on the top surface of the circuit substrate.

Example 19: The device or method of Example 18, where the centrally-disposed conductive pillar passes electrically couples the electronic component one of the first set of the conductive pillars.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no Intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in one or more embodiments of the depicted subject matter.

What is claimed is:

1. A method of forming a device package, the method comprising:
    providing an electrically conductive manifold that includes a frame structure that defines a plane and electrically conductive pillars that protrude from the frame structure in a direction perpendicular to the plane defined by the frame structure;
    encapsulating the manifold in a volume of molding material and bonding the manifold to a first fir of a circuit substrate such that a surface of the manifold in the plane defined by the frame structure is an exposed surface disposed above the circuit substrate and surrounded by the volume of molding material; and
    selectively removing material of the frame structure to separate the electrically conductive pillars from each other;
    wherein one or more of the electrically conductive pillars is electrically coupled to an electronic component disposed on the circuit substrate:
    wherein the manifold is formed from a first metallic material;
    wherein the method further comprises a masking material patterned on the exposed surface of the manifold; and
    wherein the method further comprises performing an etching process that preferentially removes the first metallic material compared to the masking material.

2. The method of claim 1,
    wherein depositing the masking material on the exposed surface of the manifold comprises covering a central portion of the frame structure above each conductive pillar and leaving peripheral portion of the frame structure above each conductive pillar exposed; and
    wherein selectively removing the material of the frame structure forms a tenon-shaped metal structure that is exposed at a surface of the volume of molding material.

3. The method of claim 1,
    wherein one or more conductive pillars pass through the volume of molding material to contact an electronic component disposed on the first surface of the circuit substrate.

4. The method of claim 1,
    wherein one or more conductive pillars pass through a portion of the volume of molding material without contacting the first surface of the circuit substrate.

5. The method of claim 1,
    wherein one or more conductive pillars pass through a portion of the volume of molding material and are disposed above a first electronic component on the first surface of the circuit substrate without contacting the first electronic component.

6. The method of claim 1,
    wherein the circuit substrate includes a thermally conductive structure that passes through a thickness of the circuit substrate; and
    wherein the thermally conductive structure is thermally coupled to a first electronic component on the first surface of the circuit substrate and is configured to transfer heat between the first electronic component and an external surface of the device package formed by a bottom surface of the circuit substrate.

7. The method of claim 1,
    wherein a first set of the conductive pillars is disposed along a periphery of the device package; and
    wherein the device package includes a centrally-disposed conductive pillar that passes through the volume of molding material and is surrounded by the first set of the conductive pillars.

8. The method of claim 7,
    wherein the centrally-disposed conductive pillar is electrically coupled to one or more of the first set of the conductive pillars.

9. A method of forming a device package, the method comprising:
    providing an electrically conductive manifold that includes a frame structure that defines a plane and electrically conductive pillars that protrude from the frame structure in a direction perpendicular to the plane defined by the frame structure;
    encapsulating the manifold in a volume of molding material and bonding the manifold to a first surface of a circuit substrate such that a surface of the manifold in the plane defined by the frame structure is an exposed surface disposed above the circuit substrate and surrounded by the volume of molding material; and
    selectively removing material of the frame structure to separate the electrically conductive pillars from each other;
    wherein one or more of the electrically conductive pillars is electrically coupled to an electronic component disposed on the circuit substrate:
    forming a recessed area in the volume of molding material prior to bonding the manifold to the first surface of the circuit substrate;
    wherein bonding the manifold to the first surface of the circuit substrate forms a hollow cavity between the first surface of the circuit substrate and the volume of molding material.

10. The method of claim 9,
    wherein one or more conductive pillars pass through the volume of molding material and the hollow cavity to contact the first surface of the circuit substrate.

11. The method of claim 9,
    wherein one or more conductive pillars pass through the volume of molding material and the hollow cavity to contact an electronic component disposed on the first surface of the circuit substrate.

12. The method of claim 9, wherein the hollow cavity is defined by the recessed area in the volume of molding material being disposed above the first surface of the circuit substrate.

13. A method of forming a device package, the method comprising:
  providing an electrically conductive manifold that includes a frame structure that defines a plane and electrically conductive pillars that protrude from the frame structure in a direction perpendicular to the plane defined by the frame structure;
  encapsulating the manifold in a volume of molding material and bonding the manifold to a first surface of a circuit substrate such that a surface of the manifold in the plane defined by the frame structure is an exposed surface disposed above the circuit substrate and surrounded by the volume of molding material; and
  selectively removing material of the frame structure to separate the electrically conductive pillars from each other;
  wherein the device package includes a cavity disposed between the volume of molding material and the first surface of the circuit substrate; and
  wherein one or more of the electrically conductive pillars are electrically coupled to electronic components disposed on the circuit substrate; and
  wherein the manifold is encapsulated prior to bonding the manifold to the first surface of the circuit substrate.

14. The method of claim 13, wherein encapsulating the manifold in the volume of molding material comprises:
  encapsulating a peripheral portion of the manifold that includes a first set of the electrically conductive pillars such that the volume of molding material extends to a first distance beyond a top surface of the manifold in the direction perpendicular to the plane defined by the frame structure; and
  encapsulating a central portion of the manifold that is surrounded by the peripheral portion of the manifold such that the volume of molding material extends to a second distance that is less that the first distance beyond the top surface of the manifold in the direction perpendicular to the plane defined by the frame structure.

15. The method of claim 13, wherein one or more electronic components are disposed within the cavity on the first surface of the circuit substrate.

16. The method of claim 13,
  wherein a first set of the conductive pillars is disposed along a periphery of the device package surrounding the cavity; and
  wherein the device package includes a centrally-disposed conductive pillar that passes through the volume of molding material and is surrounded by the first set of the conductive pillars.

17. The method of claim 16,
  wherein the centrally-disposed conductive pillar is electrically coupled to one or more of the first set of the conductive pillars.

18. The method of claim 16,
  wherein the centrally-disposed conductive pillar passes through the cavity and contacts an electronic component disposed on the top surface of the circuit substrate.

19. The method of claim 18,
  wherein the centrally-disposed conductive pillar passes electrically couples the electronic component one of the first set of the conductive pillars.

* * * * *